United States Patent [19]

Müller et al.

[11] 4,209,743
[45] Jun. 24, 1980

[54] CIRCUIT ARRANGEMENT FOR MEASURING CURRENTS AT HIGH POTENTIAL

[75] Inventors: Bruno Müller; Ulrich Baumgärtl, both of Berlin; Werner Kohler, Bentfeld, all of Fed. Rep. of Germany

[73] Assignee: Siemens Aktiengesellschaft, Munich, Fed. Rep. of Germany

[21] Appl. No.: 936,525

[22] Filed: Aug. 24, 1978

[30] Foreign Application Priority Data

Aug. 24, 1977 [DE] Fed. Rep. of Germany ....... 2738558

[51] Int. Cl.² .................. G01R 31/00; H04B 9/00
[52] U.S. Cl. ..................... 324/96; 455/602; 455/613
[58] Field of Search ............. 324/96, 127; 307/311; 250/199, 227; 350/96, 10

[56] References Cited

U.S. PATENT DOCUMENTS

| | | | |
|---|---|---|---|
| 3,488,586 | 1/1970 | Watrous et al. | 250/199 |
| 4,126,825 | 11/1978 | Houston et al. | 324/96 |

FOREIGN PATENT DOCUMENTS

1591972  3/1971  Fed. Rep. of Germany ............ 324/96

*Primary Examiner*—Rudolph V. Rolinec
*Assistant Examiner*—Ernest F. Karlsen
*Attorney, Agent, or Firm*—Kenyon & Kenyon

[57] ABSTRACT

In a circuit arrangement for measuring currents at high potential, a capacitor, charged in accordance with the current to be measured, is shunted by a light emitting diode which generates a light pulse sequence with a frequency proportional to the current. In series with the diode is a switching element with a control terminal, to which the output of a control device is connected. The input of the control device is connected to a threshold arrangement disposed parallel to the capacitor and the supply terminals of the control device are connected to the capacitor.

7 Claims, 3 Drawing Figures

CIRCUIT ARRANGEMENT FOR MEASURING CURRENTS AT HIGH POTENTIAL

BACKGROUND OF THE INVENTION

The invention relates to circuit arrangements for measuring currents at high potential in general and more particularly to such an arrangement which utilizes a light emitting diode.

Circuit arrangements consisting of a measured value generator with a capacitor which is charged by a current proportional to the current to be measured and is discharged via a parallel connected light emitting diode when a defined voltage is reached to generate a sequence of light pulses with frequency proportional to the current to be measured, which sequence is transmitted, via an optical transmission path, to a measurement value receiver with a photo element, are known. In one known circuit arrangement of this type (German Auslegesschrift No. 15 91 972), a four-layer diode, which becomes conducting when the defined voltage at the capacitor is exceeded, is connected in series with the light emitting diode, so that a discharge current flows in the branch parallel to the light emitting diode. This discharge current excites the light emitting diode to emit light. Due to the discharge, the capacitor voltage drops, so that the parallel branch finally ceases to conduct. The capacitor is thereupon charged again, the shunt branch becomes conducting and a new light pulse is generated. The number of light pulses delivered per unit time is therefore proportional to the current to be measured.

It is a particular disadvantage of the known circuit arrangement that its dynamic range and therefore, its measuring range, is limited by the firing and holding current of the four-layer diode.

SUMMARY OF THE INVENTION

It is an object of the present invention to provide a circuit arrangement for measuring currents at high potential with a capacitor, which circuit has a relatively large measuring range.

To solve this problem, according to the present invention, in a circuit arrangement of the kind described at the outset, a switching element with a control terminal is arranged in series with the light emitting diode. A control device requiring little operating power and having an input which is connected to a threshold device for fixing the defined voltage, and the supply terminals of which are connected to the capacitor, has its output connected to the control terminal.

It is an important advantage of the circuit arrangement according to the present invention that a four-layer diode in series with the light emitting diode is dispensed with, inasmuch as a threshold device is provided which, via a switching element arranged in series with the light emitting diode, causes the switching element to close via a control device connected thereto, if the defined voltage at the capacitor is reached due to the charge by a current proportional to the current to be measured. A limitation of the dynamic or measuring range by the firing and holding current of a four-layer diode is thereby avoided. The use of an additional control device creates no particular problems because a control device with low operating power consumption is used, which therefore can be supplied with operating power from the current charging the capacitor, without falsification of the measurement result. In spite of the employment of a control device with the above-mentioned advantages, the advantage of the known circuit arrangement is therefore retained, namely, that a separate energy supply source for the circuit arrangement for measuring the current at high potential is not required.

It has been found to be particularly advantageous, in view of achieving a low operating power requirement, in the circuit arrangement according to the invention, that the control device consists of a univibrator formed as an integrated building block using complementary metal oxide gate technology.

The circuit arrangement according to the present invention works best if the capacitor is charged by the current proportional to the current to be measured via a resistor, the resistance of which is determined by the quotient of the discharge time of the capacitor and the capacity of the capacitor; the threshold device is connected to the ends of the series circuit consisting of the resistor and the capacitor. This embodiment of the circuit arrangement according to the present invention has the advantage that there is a linear relationship between the current to be measured and the frequency of the light pulses.

This advantage is due to the fact that, with the circuit arrangement according to the invention, the frequency f of the light pulses as a function of the capacity C of the capacitor, the defined voltage $U_d$ and the discharge time $t_e$ of the capacitor can be described by the following Equation (1):

$$f = \frac{1}{\frac{C \cdot U_d}{I - I_1} + t_e} \quad (1)$$

In this equation, I designates the current proportional to the current to be measured and $I_1$ the loss current in the control device. If one now considers that, in a control device consisting of integrated building blocks using complementary metal oxide gate technology (CMOS), the loss current $I_1$ is negligibly small because the operating power required of such components is very small, then, according to the above equation, the deviation from a linear relation between the current I proportional to the current to be measured and the frequency f of the light pulses is caused by the discharge time $t_e$ of the capacitor. The capacitor cannot be discharged arbitrarily fast, so that the discharge time becomes strongly noticeable even at frequencies of a few kHz.

By inserting a resistor with the resistance R designed as given above, Eq. (1) can be transformed into the following Eq. (2):

$$f = \frac{1}{\frac{C \cdot (U_d - I \cdot R)}{I} + t_e} = \frac{1}{\frac{C \cdot U_d}{I} + C \cdot R + t_e} \quad (2)$$

If the resistance R is now chose so that it fulfills:

$$C \cdot R = t_e \quad (3)$$

then one obtains from Eq. (2) the relation:

$$f = I/C \cdot U_d = I/Q \quad (4)$$

where the quantity Q is a constant. By arranging a resistor, with the resistance given, an almost exact linear relationship between the frequency f of the light pulses and the current to be measured of a current proportional thereto, I, can be established.

It has further been found to be advantageous if a resistor is shunted across the light emitting diode. By means of this resistor, the discharge time of the capacitor can advantageously be shortened.

DETAILED DESCRIPTION OF THE INVENTION

Figure 1:
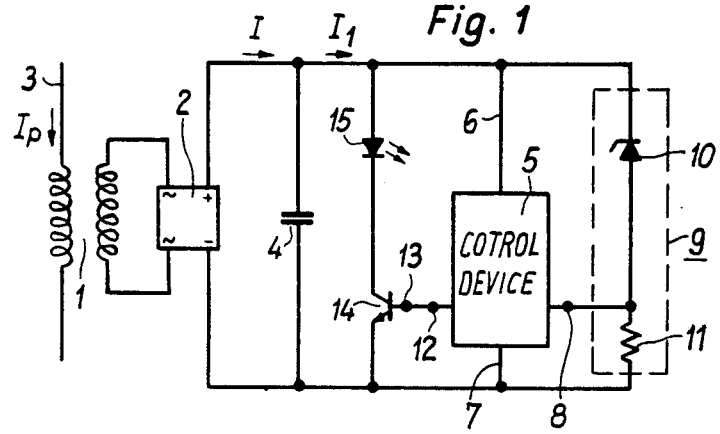
FIG. 1 is a schematic diagram of an embodiment of the circuit arrangement according to the present invention with a control device shown in the form of a block.

The circuit arrangement shown in FIG. 1 is supplied, via a current transformer 1 and a bridge rectifier 2 following the latter, with a current I which is proportional to a current $I_p$ flowing in the line 2 at high voltage potential. A capacitor 4 is connected to the d-c outputs of the bridge rectifier 2 and is therefore charged by the current I. Connected parallel to the capacitor 4 is a control device 5 with supply terminals 6 and 7. At its input 8, the control device 5 is connected to a threshold device 9 which, in the illustrated embodiment, consists of a Zener diode 10 in series with a resistor 11; the threshold device 9 is likewise arranged parallel to the capacitor 4. The output 12 of the control device 5 is connected to the control terminal 13 of a switching element which is arranged in series with a light emitting diode 15. The light emitting diode 15 and the switching element are likewise arranged parallel to the capacitor 4.

The circuit arrangement shown operates as follows: The current I proportional to the current $I_p$ to be measured charges the capacitor 4 until the voltage across it corresponds to the level of the defined voltage. The voltage is defined by the Zener diode 10, so that the latter breaks through when this voltage is reached and supplies an input pulse at the control device 5 by means of the resistor 11 connected in series therewith. The control device 5 thereupon delivers a switching pulse to the switching element 14, which thereby opens a circuit via the light emitting diode and thus causes the capacitor 4 to discharge, giving off a light pulse. Thereupon, the capacitor 4 is charged again and after the defined voltage is reached, a light pulse is again produced. Since the reaching of the defined voltage at the capacitor 4 depends on the magnitude of the current I, light pulses are generated with the same dependence on the current I, so that their frequency is proportional to the current I or the current $I_p$ to be measured. The current $I_1$ for the operating power supply has no appreciable influence on the linear relationship, as it is negligibly small if a control device with low operating power consumption is used.

Figure 2:
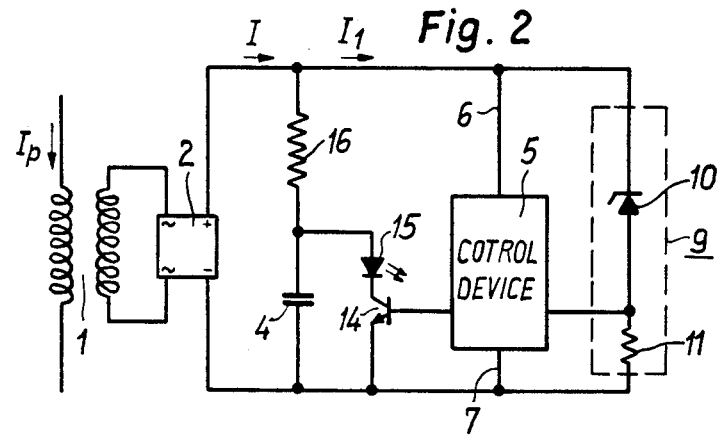
FIG. 2 is a schematic diagram of a further embodiment with a resistor connected in series with the capacitor.

The embodiment of the circuit arrangement according to the invention shown in FIG. 2 agrees in substance with that according to FIG. 1, so that the same reference symbols have been used for identical components. There is a deviation with respect to the use of a resistor 16, which is arranged in series with the capacitor 4, in order to obtain the above-mentioned linear relationship between the current to be measured $I_p$ or the current I proportional thereto and the frequency of the light pulses emitted by the light emitting diode 15. A further difference is that the threshold device 9 is connected across the series circuit consisting of the resistor 16 and the capacitor 4, as well as the supply leads 6 and 7 of the control device 5, while the light emitting diode 15 and the switching element 14 connected in series therewith are only shunted across the capacitor 4.

Apart from the advantageous effect of the resistor 16, the circuit arrangement according to FIG. 2 operates, in principle, in the same manner as that according to FIG. 1.

The embodiment of FIG. 3 also again contains a current transformer 20 followed by a bridge rectifier 21, to which a capacitor 22 is connected; optionally, a resistor for linearizing the dependence of the frequency of the light pulses on the current to be measured can again be associated with the capacitor 22. The capacitor 22 is again shunted by a threshold device 23 which, in the embodiment shown, in addition to a Zener diode 24 and a resistor 25, contains a diode 26. Via a transistor 27 and two resistors 28 and 29, the threshold device 23 is connected to a control device 30, which is an integrated circuit using complementary metal oxide gate technology. To this building block is additionally connected a capacitor 31 and, to obtain operating power supply, it is connected via a diode 32 to the bridge rectifier 21. The output 34 of the control device 30 is connected to the control terminal 35 of a switching element 36 which in turn is arranged in series with a light emitting diode 37, the series circuit being shunted across the capacitor 22. A resistor 38 is shunted across the light emitting diode 37 to influence the discharging behavior of the capacitor 22 in an advantageous manner.

Figure 3:
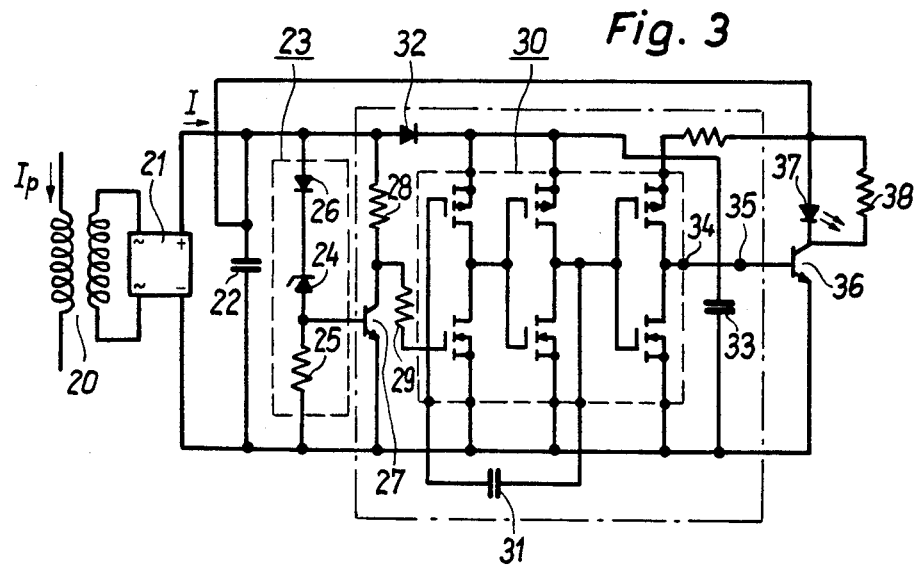
FIG. 3 is a schematic diagram of a third embodiment with a control device designed as an integrated circuit.

If a control device according to FIG. 3 is used, only a very small portion of the current I proportional to the current $I_p$ to be measured is used for the operating power supply via the diode 32, so that the linear dependence between the current to be measured $I_p$ and the frequency of the light pulses is scarcely affected; this circuit arrangement therefore permits a particularly faithful conversion into a frequency and thereby, an accurate determination of the current to be measured in a receiving device on the low voltage side.

With the present invention, a circuit arrangement for measuring currents at high potential is provided which requires no operating power supply source at the high potential and nevertheless permits a very exact determination of the current to be measured.

What is claimed is:

1. In a circuit arrangement for measuring currents at high potential, including a measurement value generator with a capacitor which is charged by a current proportional to the current to be measured and is discharged via a light-emitting diode in parallel therewith when a defined voltage is reached, whereby a sequence of light pulses with a frequency proportional to the current to be measured, for transmission via an optical transmission path to a measured value receiver with a photo element, is generated, the improvement comprising:

(a) a switching element with a control terminal coupled in series with the light-emitting diode;
   (b) a control device with low operating power consumption having supply terminals coupled to the capacitor, the output of said control device coupled to said control terminal; and (c) a threshold device shunted across said capacitor and providing an input to said control device when the defined voltage is reached.

2. The improvement according to claim 1, wherein said control device comprises a univibrator constructed as an integrated building block using complementary metal oxide gate technology.

3. The improvement according to claim 2, and further including a resistor in series with said capacitor whereby said capacitor is charged by the current proportional to the current to be measured via said resistor, the resistance of said resistor being determined by the quotient of the discharge time of the capacitor and the capacity of the capacitor, and wherein said threshold device and the supply leads of said control device are coupled to the ends of the series circuit comprising said resistor and said capacitor.

4. The improvement according to claim 3 further including a resistor shunted across said light-emitting diode.

5. The improvement according to claim 2, and further including a resistor in series with said capacitor whereby said capacitor is charged by the current proportional to the current to be measured via said resistor, the resistance of said resistor being determined by the quotient of the discharge time of the capacitor and the capacity of the capacitor, and wherein said threshold device and the supply leads of said control device are coupled to the ends of the series circuit comprising said resistor and said capacitor.

6. The improvement according to claim 5 further including a resistor shunted across said light-emitting diode.

7. The improvement according to claim 1, and further including a resistor in series with said capacitor whereby said capacitor is charged by the current proportional to the current to be measured via said resistor, the resistance of said resistor being determined by the quotient of the discharge time of the capacitor and the capacity of the capacitor, and wherein said threshold device and the supply leads of said control device are coupled to the ends of the series circuit comprising said resistor and said capacitor.

* * * * *